United States Patent [19]

Hamashima et al.

[11] Patent Number: 5,006,711
[45] Date of Patent: Apr. 9, 1991

[54] MULTIELEMENT INFRARED DETECTOR FOR THERMAL IMAGING

[75] Inventors: Shigeki Hamashima, Yokohama; Masaru Koseto, Kobe; Shoji Nomura, Kakogawa, all of Japan

[73] Assignee: Fujitsu Limited, Kawasaki, Japan

[21] Appl. No.: 413,751

[22] Filed: Sep. 28, 1989

[30] Foreign Application Priority Data

Oct. 5, 1988 [JP] Japan .................................. 63-252818

[51] Int. Cl.⁵ ............................. G01J 5/04; G01J 5/16
[52] U.S. Cl. .................................... 250/349; 250/352; 250/353; 250/370.13
[58] Field of Search ............ 250/349, 352, 353, 370.13

[56] References Cited

U.S. PATENT DOCUMENTS

| | | | |
|---|---|---|---|
| 3,581,092 | 5/1971 | Pearsall | 250/349 |
| 4,814,620 | 3/1989 | Coney et al. | 250/349 X |
| 4,883,967 | 11/1989 | Tsutsui et al. | 250/352 X |

FOREIGN PATENT DOCUMENTS

| | | | |
|---|---|---|---|
| 60-50426 | 3/1985 | Japan | 250/352 |
| 61-86620 | 5/1986 | Japan | 250/349 |

Primary Examiner—Carolyn E. Fields
Assistant Examiner—Jacob M. Eisenberg
Attorney, Agent, or Firm—Staas & Halsey

[57] ABSTRACT

A multi-element infrared detector for thermal imaging, wherein the detector includes a main substrate, an aperture plate and a plurality of detector elements formed on the main substrate and arranged thereon in an array. Each detector element having a photosensitive zone and output and common terminal electrodes formed at opposite ends thereof. The aperture plate having at least one aperture for restricting the field of view of the photosensitive zone. The detector includes an auxiliary electrode formed on the rear surface of the aperture plate in a position to contact the common terminal electrodes when the device is assembled. The infrared detector also includes a common metal line formed on the substrate in a position to interconnect a plurality of common terminal electrodes and the auxiliary electrode contacts the common metal line.

14 Claims, 4 Drawing Sheets

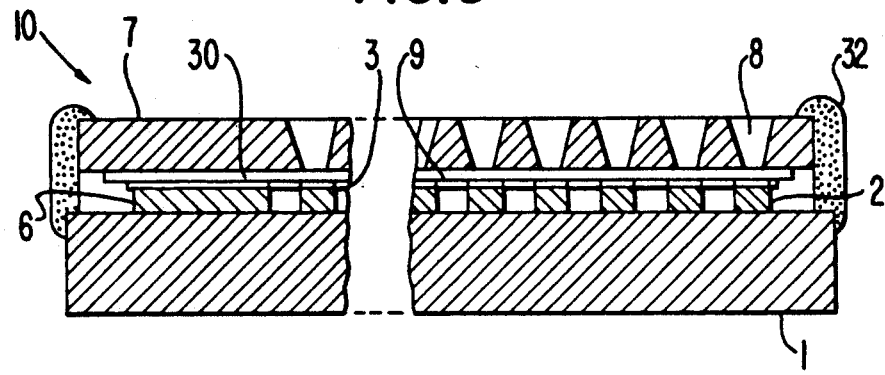
FIG. 3
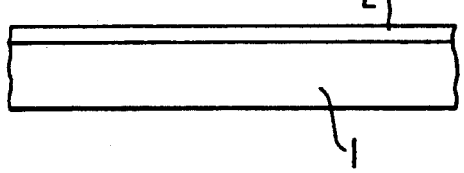
FIG. 4(a)
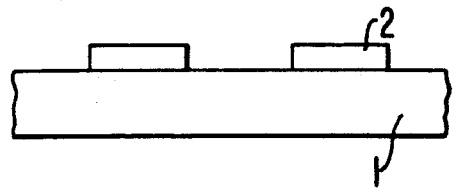
FIG. 4(b)
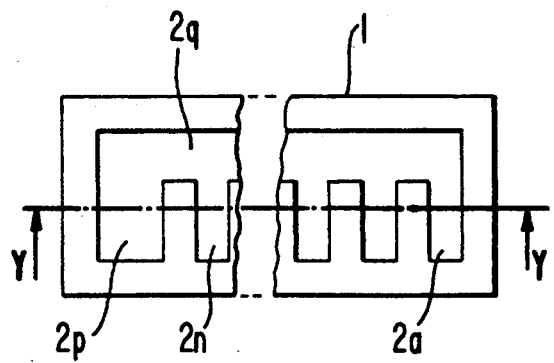
FIG. 4(b')

MULTIELEMENT INFRARED DETECTOR FOR THERMAL IMAGING

BACKGROUND OF THE INVENTION

1. Field of the Invention

This invention relates to an infrared detector which converts infrared rays to an electrical signal, and more particularly to the electrode structure for a multi-element infrared detector.

2. Description of the Related Art

It is known that all objects radiate infrared rays unless the temperature thereof is reduced to absolute zero. Therefore, when infrared rays from an object are detected by an infrared detector, the temperature thereof or temperature differences therein can be identified, and an image of the object can be obtained if the object is scanned two-dimensionally.

A single-element infrared radiation detector is easy to fabricate, however, it takes several seconds to scan a single frame on a display because the optical system including a mirror must be moved in both horizontal and vertical directions.

In order to shorten the required scan time for a single frame, a linear (one-dimensional) array of detector elements has been proposed and developed. This type of device requires an optical scan in only one direction, either horizontally or vertically, resulting in a significant curtailing of the scan time and thus facilitating the production of images nearly on a real time basis. Detectors having two-dimensional arrays, i.e., matrix arrays of detector elements make the optical scan mechanism unnecessary and are most desirable.

PbS (lead sulphide), PbSe (lead selenide), InSb (indium antimonide), PbSnTe (lead tin telluride), HgCdTe (mercury cadmium telluride), etc., are well known photoconductive materials for detecting infrared rays. Among these materials, HgCdTe has extremely high sensitivity in wavelengths ranging between about 3 and 14 $\mu$m, depending on the mole fraction x of CdTe (cadmium telluride) to HgTe (mercury telluride) in the ternary compound semiconductor $Hg_{1-x}Cd_xTe$. When x is about 0.2, the HgCdTe material has very high performance characteristics in detectivity ($D^*$) and responsivity (Re) at wavelengths of about 12 $\mu$m, and further such material has low noise characteristics and a small time constant. Therefore, HgCdTe is a very sensitive and effective material for detecting real images of objects at or near room temperature.

Generally, infrared detectors using the above photoconductive materials have better characteristics when the detector elements are cooled to a low temperature. For example, HgCdTe or InSb infrared detectors are cooled to about 77° K. by liquid nitrogen during operation.

There are many problems to be solved in fabricating multi-element infrared detectors. One such problem is that uniform characteristics for a plurality of detector elements are difficult to achieve when the number of detector elements is increased. The reasons for this are as follows. During the fabrication of multi-element infrared detector elements, a first end of each detector element is connected to a common terminal of a power source to provide a bias current of a specific amount to flow through each of the detector elements. Conventionally, a common metal line connecting such first ends of the detector elements is formed on the photoconductive layer so as to run parallel to the detector element array, and such line is connected further to a terminal pad at the end portion of the array. This type of structure presents the problem that the requisite thick common metal lines are difficult to form on photoconductive layers.

But when thin lines are used instead, the resultant increase in the resistance of the detector circuit causes a reduction in the sensitivity of the device for detecting temperature differences, and further, because electrical resistance from the terminal pad to each of the detector elements differs depending on the distance between the pad and the detector, the sensitivity of each detector element is different because the bias current flows through each of the detector elements at a different rate depending on the distance of the element from the terminal pad.

A uniform electrode structure having low electrical resistance will solve the above problem if it can be easily formed. In order to form a thick metal layer on a substrate on which a photoconductive layer has previously been formed, it is necessary to first solve the problems presented by the deposition and patterning of the metal layer, because the photoconductive layers generally used are very sensitive to the wet etching solutions that have conventionally been used in the past.

SUMMARY OF THE INVENTION

Thus, it is a general object of the invention to provide a multi-element infrared detector having uniform sensitivity over a plurality of detector elements.

It is a more specific object of the invention to reduce the electrical resistance of a common electrode provided in a multi-element infrared detector for connecting to the detector elements.

It is another object of the invention to provide a multi-element infrared detector having improved sensitivity for each of its detector elements.

It is still another object of the invention to provide a multi-element infrared detector that requires less heat dissipation.

In multi-element infrared detectors, a plurality of detector elements provided on a main substrate are conventionally connected to a common metal line having an electrical resistance which is not negligible. According to the present invention, an auxiliary electrode having low electrical resistance is formed on an aperture plate such that when the aperture plate is assembled onto the main substrate, the low resistance auxiliary electrode is pressed onto a common terminal electrode of the detector elements or a common metal line on the main substrate to thus form a common electrical line with a very low electrical resistance, resulting in improvement of the overall detector characteristics.

BRIEF DESCRIPTION OF THE DRAWINGS

FIG. 3 is a cross-sectional view of the multi-element detector taken along line X—X of FIG. 2;

FIGS. 4(a) through 4(e) are schematic cross-sectional views of the main substrate of an embodiment of the present invention illustrating the various fabrication steps, and FIGS. 4(b'), 4(d') and 4(e') are plan views at corresponding steps, and in this regard, FIG. 4(b) is a cross-sectional view taken along the line Y—Y of FIG. 4(b'), FIG. 4(d) is a cross-sectional view taken along line Y—Y of FIG. 4(d') and FIG. 4(e) is a cross-sectional view taken along the line Y—Y of FIG. 4(e');

Throughout the drawings, the same reference numerals are used to designate and identify the same or similar parts.

DETAILED DESCRIPTION OF THE PREFERRED EMBODIMENTS

Figure 1:
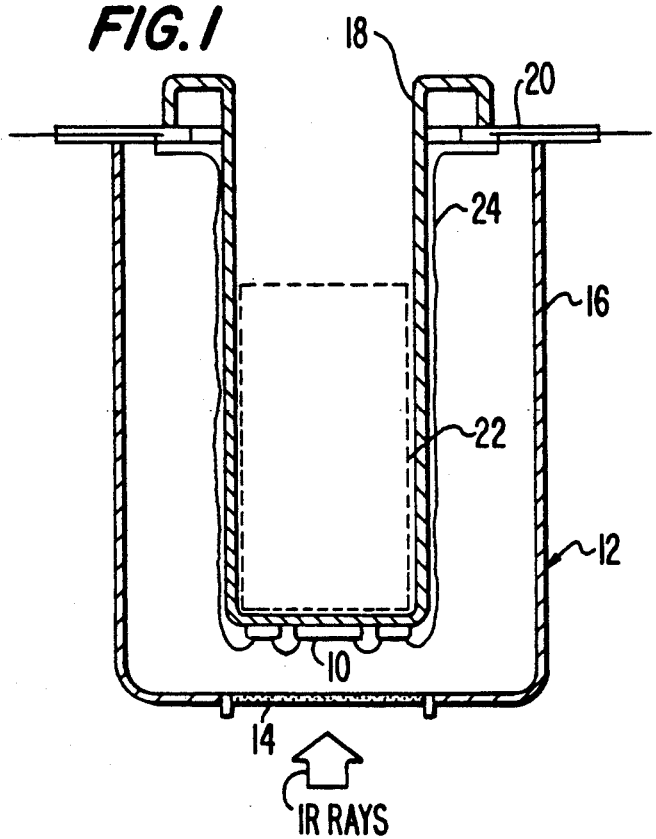
FIG. 1 is a schematic cross-sectional view of an infrared detector package in which a multi-element infrared detector of the present invention is mounted.

FIG. 1 is a schematic cross-sectional view of an infrared detector package 12 in which a multi-element infrared detector array 10 that embodies the invention is mounted. The detector array 10 comprises detector elements of HgCdTe that require cooling during operation. Therefore, in this case, a vacuum Dewar flask construction is utilized. Accordingly, the package 12 includes an outer cylindrical member 16 made of metal or glass and having an infrared receiving window 14 therein. Window 14 is made of a material such as germanium or silicon that is transparent to infrared rays and the same is sealed to the bottom portion of member 16 as illustrated. An inner cylindrical member 18 made of glass is sealed to the outer cylindrical member 16, and a ring shaped ceramic insulator 20 is interposed therebetween.

The multi-element infrared detector array 10 of the present invention is disposed on the bottom surface of the inner cylindrical member 18 inside vacuum Dewar flask 12, and the array 10 is fixed to member 18 by adhesive. Hermetically sealed leads 24, which are connected to respective infrared detector elements, are lead out of the Dewar flask 12 through the ceramic insulator 20.

A cooling means 22 is provided in the flask 12 during operation. The necessary cooling temperature conditions are provided depending on the wavelengths of the infrared rays to be detected and the photoconductive material used for the detector elements. In the illustrated embodiment, a detector element made of HgCdTe is used, and therefore, the detector array is generally cooled to about 77° K. Liquid nitrogen used in a conventional manner to fill the flask 12 is employed as the cooling means 22. A Joule-Thomson cooler can also be used as the cooling means 22.

Figure 2:
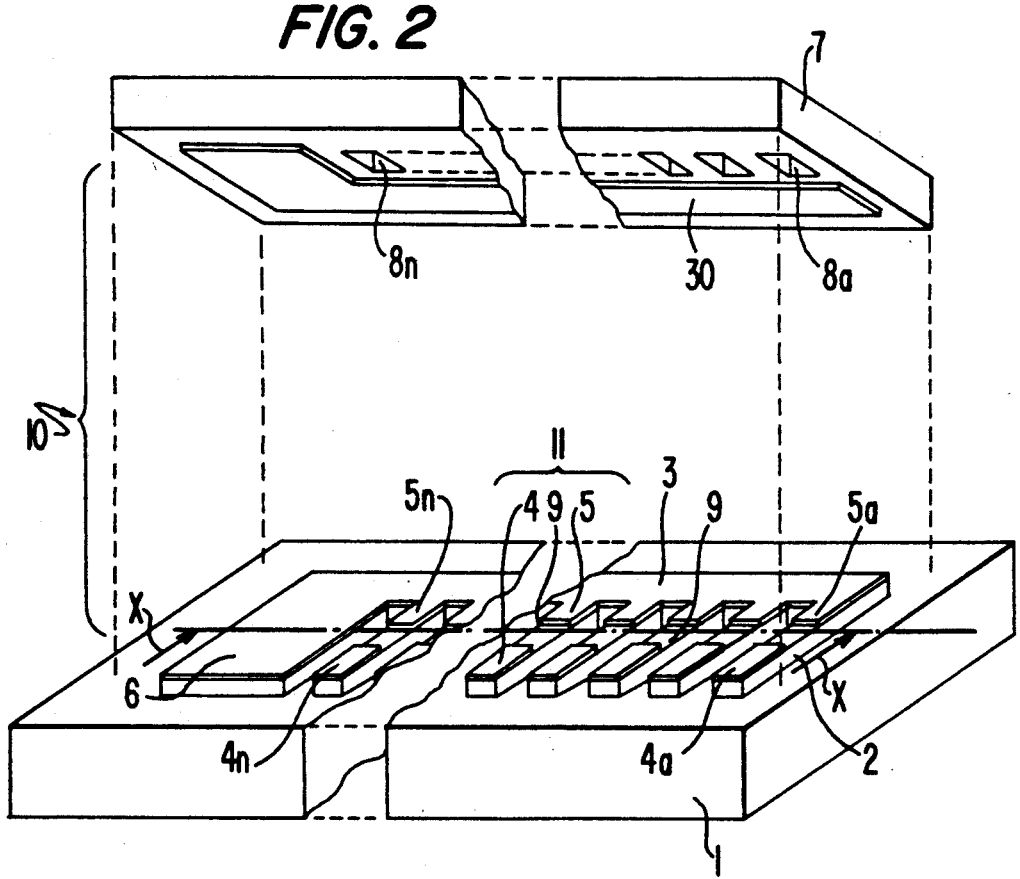
FIG. 2 is a schematic perspective view of an infrared detector of the present invention with the aperture plate thereof separated for improved clarity.

FIG. 2 is a schematic perspective view of a multi-element infrared detector array in which the present invention is applied. In order to clearly illustrate the detector array formed on a ceramic substrate the aperture plate 7 is removed and shown separately. FIG. 3 is a schematic cross-sectional view taken along the line X—X of FIG. 2. In actual devices, sometimes more than one hundred detector elements may be formed on the substrate 1, however, only a few of them are shown in FIGS. 2 and 3 for simplicity.

Ceramic substrate 1 having the detector elements 11 formed thereon may itself be formed from a material such as sapphire because sapphire has good thermal conductivity at cryogenic temperatures and a similar expansion coefficient to that of HgCdTe. Thus, the sapphire substrate 1 cools the detector elements effectively when the infrared detector 10 is mounted in the flask 12 and cooled by the cooling means 22 as shown in FIG. 1.

Each detector element 11 includes a photosensitive zone 9 and two (output and common) terminal electrodes 4 and 5, and the detector elements 11 are arranged in an array protruding from a common metal line 3. The terminal electrodes 4 and 5 and the common metal line 3 are formed on a comb-like patterned photoconductive layer 2. The surface of the photoconductive layer 2 is exposed at each of the photosensitive zones 9 and other areas are covered with the metal layer forming output terminal electrodes 4 (4a to 4n), common terminal electrodes 5 (5a to 5n), and the common metal line 3. In the embodiment shown, the common metal line 3 is also connected to a terminal pad 6. However, other structures may be possible such that the photoconductive layer is patterned forming a linear array of detector elements without the common metal line 3. In such a case, the common terminal electrodes 5 may be connected separately to lead wires.

The aperture plate 7 may be made of silicon or zinc sulphide (ZnS), both being transparent to infrared rays. A plurality of apertures 8 (8a to 8n) are formed therein by an anisotropic etching method. In the embodiment shown, the apertures 8 are formed at positions corresponding to the positions of the respective photosensitive zones 9 of the detector array. The surface of the aperture plate is covered by a shield layer to shield against incident infrared rays. When a silicon aperture plate is used, a silicon nitride layer ($Si_3N_4$) or a multilayer structure comprising a silicon nitride layer is utilized as the shield layer. When a zinc sulphide aperture layer is used, a layer of a metal such as aluminum is utilized as the shield layer.

A main purpose of the aperture plate 7 having the apertures therein is to restrict the field of view of the photosensitive zones 9, in other words, to restrict the access of incident infrared rays from the background to the photosensitive zones 9. Therefore, the shape of the apertures and the number thereof may be changed depending on the requirements of the infrared detector.

In accordance with one embodiment of the present invention, an auxiliary electrode 30 is formed on the rear surface of the aperture plate 7. When the aperture plate 7 is assembled with the main substrate 1 using an adhesive 32 (See FIG. 3), the auxiliary electrode 30 is pressed against the common metal line 3 and common terminal electrodes 5, and the electrode 30, line 3 and electrodes 5 all work together to reduce the overall electrical resistance. The auxiliary electrode 30 can be formed with a comparatively large thickness and thus low electrical resistance. On the other hand, the common metal line 3 on the photoconductive layer 2 cannot be formed with enough thickness so that the electrical resistance thereof can be neglected. Even when an array of detector elements is formed o the main substrate without the common metal line 3, the auxiliary electrode 30 can fulfill the function of the common metal line when the aperture plate 7 is assembled with the main substrate 1 and the auxiliary electrode 30 is pressed against the terminal electrodes 5.

The reason why the common metal line 3 cannot be made thick enough, is related to the manufacturing processes available for preparing the multi-element detector array. The details of such manufacturing processes are as follows.

Figure 4C:
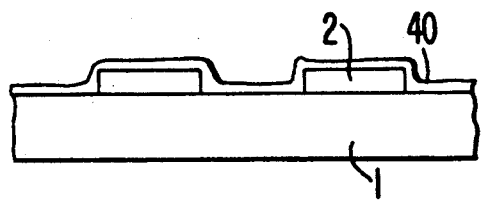

FIG. 4(a) through 4(e) are cross-sectional views corresponding to the sequential steps used for forming a HgCdTe multi-element detector array on a substrate. A sapphire substrate 1 having a thickness ranging from 300 to 500 μm is utilized. A monocrystalline HgCdTe photoconductive material is glued to the sapphire substrate 1 with an adhesive and the surface thereof is subjected to mechanical polishing and etching processes until a predetermined thickness of the photoconductive layer 2 is obtained as shown in FIG. 4(a). The predetermined thickness depends on the kind of photoconductive material, and, in case of HgCdTe, a thickness of about 10 μm (from 8 to 12 μm) is utilized.

The entire surface of the photoconductive layer 2 is coated with a photoresist layer (not shown) and the same is patterned using a conventional photolithography technique. The exposed surface of the photoconductive layer is wet etched using a solution comprising bromine (Br) such as Brmethylalcohol, and thereafter the remaining photoresist layer is removed. As shown in FIGS. 4(b) and 4(b') the patterned photoconductive layer 2 has a comb-like shape and a thickness of about 10 μm. In this embodiment, the pattern has an array portion forming detector elements 2a to 2n, a pad portion 2p and a common line 2q. The elements of the array portion 2a to 2n run parallel with each other, have equal gaps of about 50 μm therebetween and are connected to the common line 2q. In the illustrated embodiment, each array element is connected vertically to the common line 2q.

Figure 4D:
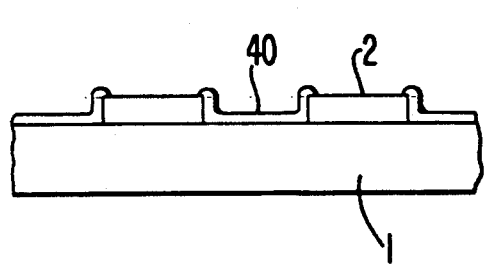

The entire surface of the substrate is again coated with another photoresist layer 40 as shown in FIG. 4(c). Using a photomask, the surface of photoresist layer 40 is exposed and developed by a conventional photolithography technique so as to form areas for output terminal electrodes 4, common terminal electrodes 5, common metal line 3 and terminal pad 6. Photosensitive zones 9 and other areas on the substrate 1 remain covered by the photoresist layer 40. The hatched areas of FIG. 4(d') represent the exposed surface and FIG. 4(d) is a cross-sectional view taken along line Y—Y of FIG. 4(d'). There is a steep step of about 10 μm from the upper surface of the photoconductive layer 2 to the substrate 1, therefore, a maximum thickness of 2 to 3 μm is allowed for the photoresist layer 40.

A metal layer 42 is deposited on the entire surface by a sputtering process, and, thereafter, the photoresist layer 40 and the metal layer deposited thereon are removed by a lift-off process. As the material for the metal layer 42, indium (In), gold (Au) or a gold alloy are used. The maximum thickness thereof is limited to less than about 1.5 μm due to the operational characteristics of the lift-off process. Generally, a thin film having a thickness of 1.0 to 1.5 μm is utilized. This is the reason why the electrical resistance of the common metal line 3 is at a level which cannot be neglected. After the lift-off process, the metal layer 42 remains at the preselected areas so as to form common metal line 3, output terminal electrodes 4, common terminal electrodes 5, and terminal pad 6.

Figure 4E:
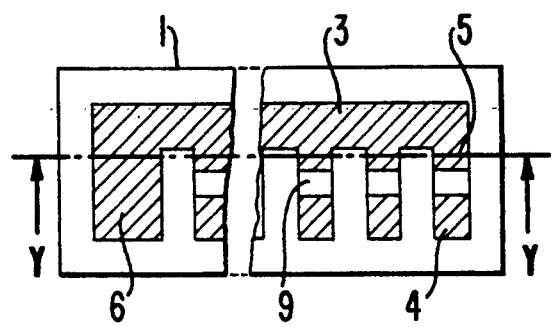
Figure 4E:
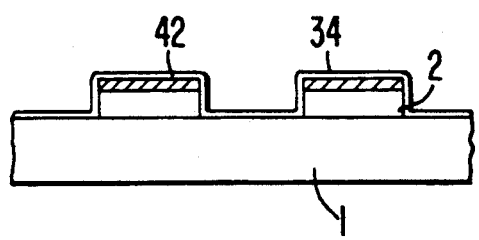

Thereafter, a thin film 34 of zinc sulphide is formed on the detector elements for purposes of protection and anti-reflection. FIG. 4(e) is a cross-sectional view illustrating the manner in which the metal layer 42 and the thin film 34 are formed on the photoconductive layer 2, and FIG. 4(e') is a plan view of the detector device.

When the common metal line 3 is formed from indium and has dimensions of, for example, a thickness of 1.0 μm, 1 width of 100 μm, and a total length of about 3 mm, the same has an electrical resistance of about 6 ohms for the most distance detector element. To express the sensitivity of the infrared detector, the term responsivity (Re) is widely used. Re is the ratio of output voltage to radiant input power expressed in volts per watt. A detector element formed from HgCdTe and having a photosensitive zone that is 50 μm square, and which is connected to the above common metal line, exhibits the following responsivity date, $Re_1 = 4.0 \times 10^4$ VW$^{-1}$ (for the nearest element), and
$Re_2 = 3.5 \times 10^4$ VW$^{-1}$ (for the farthest element).

The above data show that the responsivity difference between the two detector elements is more than 10%. In the illustrated device, such differences are compensated for by the structure of the aperture plate of the present invention.

With regard to the fabrication of the aperture plate 7, a monocrystalline silicon substrate having a thickness ranging from 30 μm to 400 μm and a specific surface orientation, is provided. Both surfaces of the silicon substrate are first subjected to thermal oxidation so as to form a silicon dioxide film thereon. A plurality of square openings are formed in the outer silicon dioxide film by a conventional photolithography method. The positions of such square openings are arranged so as to be in alignment with the photosensitive zones 9 of the photoconductive layer 2 when the aperture plate 7 is assembled with the main substrate 1. Thereafter, the silicon substrate is subjected to a known anisotropic wet etching process, resulting in the formation of a pyramidal perforation or aperture 8 at each location where an opening is desired.

Figure 5:
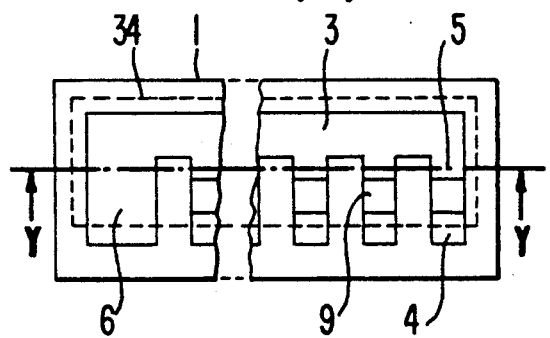
FIG. 5 is a rear view of the aperture plate of the present invention.
Figure 5:
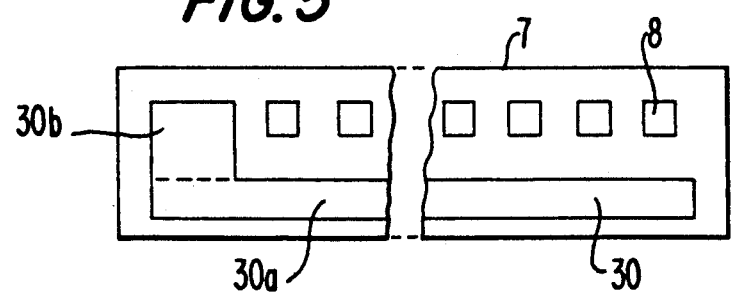

In the embodiment of the present invention, the auxiliary electrode 30 is formed on the aperture plate 7 as shown in FIG. 5. The surface that is to face the main substrate 1 is coated with a photoresist layer and the same is patterned by a conventional photolithography technique. An opening which is substantially the same pattern as the desired auxiliary electrode is formed in the photoresist layer as shown in FIG. 5. The opening has a rectangular pattern 30a having sufficient size to cover the common terminal electrodes 5 and common metal line 3 on the main substrate 1, but this requirement is not so strict. The opening as shown in FIG. 5 has a shape that is the mirror image of common metal line 3, terminal pad 6 and common terminal electrodes 5 on the main substrate. The opening has an L-shaped pattern that includes a terminal pad portion 30b.

The entire surface of the aperture plate 7 is subjected to a sputtering process and a material such as indium, gold, or gold alloy is deposited thereon. Thereafter, the remaining photoresist layer and the metal layer deposited thereon are removed by a lift-off technique to present a rectangular or an L-shaped auxiliary electrode 30, which has a thickness of greater than 5 μm, and preferably about 10 μm on the aperture plate 7. FIG. 5 is a rear plan view of the aperture plate 7.

When zinc sulphide (ZnS) is used as the substrate for the aperture plate, an aluminum film is deposited on an outer surface of the substrate. The aluminum film is patterned by a photolithography technique forming a plurality of windows. In this case, no perforations are formed in the substrate. The other processes for forming the auxiliary electrode 30 using a ZnS substrate are similar to those explained for the silicon substrate.

The processes for fabricating the aperture plate may be conducted in other ways, the above method being just illustrative and conventional. The important feature of the present invention is that the thickness of the auxiliary electrode 30 on the aperture plate is not limited to less than 1.5 μm as in case of the common metal line 3 on the main substrate, but rather, thicknesses of 10 μm or greater are readily achieved. Further the width of the auxiliary electrode may easily be increased. As a result, the electrical resistance thereof can be reduced to a level ranging from one-tenth to one-hundredth of that of the common metal line 3. The auxiliary electrode 30 is arranged in parallel with the first metal line on the main substrate 1, thus reducing the effective electrical resistance to each of the detector elements. The differences in sensitivity between the detector elements that result, as previously disclosed, in devices not equipped with the auxiliary electrode, are eliminated.

Finally, when the aperture plate 7 of FIG. 5 is disposed on the main substrate 1 of FIG. 4(e') and fixed thereto by adhesive such that the auxiliary electrode 30 and common metal line 3 are in close contact with each other, a multi-element infrared detector 10 is completed as explained previously in FIGS. 2 and 3.

Figure 6:
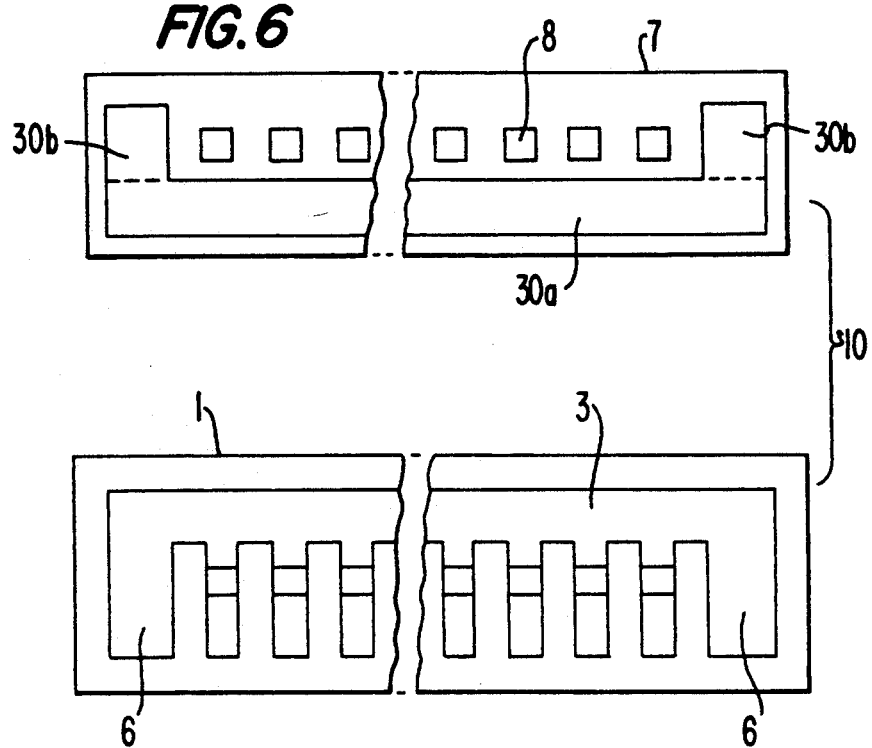
FIG. 6 is a schematic, exploded view illustrating the main substrate and the aperture plate of another embodiment of the present invention, in which two terminal pads are formed.

In the above embodiment, the terminal pad 6 is formed at one end of the common metal line 3. When the number of detector elements is increased, terminal pads 6 may be formed at each end of the array. The present invention is also applicable for this type of device. Plan views of a main substrate 1 and a turned over aperture plate 7 are shown separately in FIG. 6. The auxiliary electrode 30 of this embodiment has two pad portions 30b forming a U-shaped pattern.

In the above embodiments, the dimensions of each detector element, i.e., each photosensitive zone 9 of the photoconductive layer 2, are set to be about 50 μm × 50 μm, and the pitch between adjacent elements is set to be 100 μm. A gap of only 50 μm between adjacent elements results in a deterioration of the quality of the scanned image.

Figure 7:
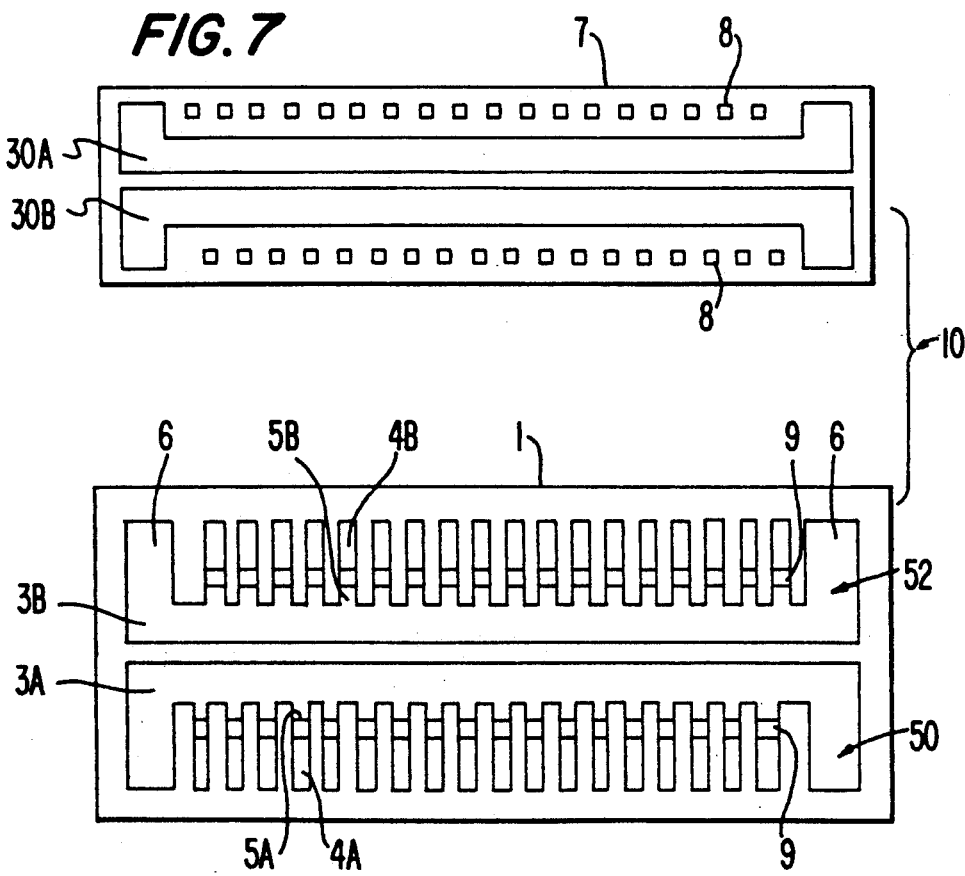
FIG. 7 is a schematic, exploded view illustrating the main substrate and the aperture plate of still another embodiment of the present invention, in which two multi-element detector arrays are formed on the main substrate and each array has two terminal pads.

In order to alleviate this problem, a multi-element infrared detector which comprises two arrays of detector elements has been developed. Two detector arrays 50 and 52 are arranged as shown in FIG. 7, where it can be seen that the arrays are parallel with each other and have a predetermined distance therebetween. However, the positions of the detector elements for the second detector array 52 are shifted or staggered relative to the positions of the detectors of the first detector array 50 by a half pitch of the element spacing. Thus, the blank positions of the first detector array 50 are filled in by a detector element of the second detector array 52. In FIG. 7, the multi-element infrared detector 10 has 36 elements, with each array having 18 detector elements, however, the number of detector elements may easily be increased to more than one hundred elements.

A bottom plan view of an aperture plate 7 of a multi-element infrared detector 10 having two detector arrays is illustrated in the upper portion of FIG. 7. Two common metal lines 3A and 3B, each having a terminal pad 6 at each end thereof, are formed on the main substrate 1. The auxiliary electrodes 30A and 30B of the present invention are formed on aperture plate 7 in positions corresponding to the positions of common metal lines 3A and 3B, and common terminal electrodes 5A and 5B respectively.

Throughout the embodiments disclosed above, each detector element 11, as shown in FIG. 2, and having an output terminal electrode 4 and a common terminal electrode 5, is connected to a single common metal line 3. The electrode structure on the main substrate is not restricted to such a pattern.

An array of detector elements 1 may be formed independently and separated from each other, having no common metal line on the main substrate. In this case, the common terminal electrodes 5 of the detector elements contact the auxiliary electrode 30 on the aperture plate 7 when assembled, and the auxiliary electrode alone performs the same function as that of a combination of common metal line and the auxiliary electrode in the previous embodiments.

The present invention may be embodied in other specific forms without departing from the spirit or essential characteristics thereof. The presently disclosed embodiments are therefore to be considered in all respects as illustrative and not restrictive, the scope of the invention being indicated by the appended claims, rather than the foregoing description, and all changes which come within the meaning and range of equivalence of the claims are, therefore, to be embraced therein.

What is claimed is:

1. A multi-element infrared detector comprising a substrate, a plurality of detector elements formed on the substrate and arranged thereon in an array at predetermined intervals, each of said detector elements having a photosensitive zone and output and common terminal electrodes formed at respective opposite ends thereof, an aperture plate disposed over the detector elements, the aperture plate having at least one aperture for restricting the field of view of the photosensitive zone, and an auxiliary electrode formed on a surface of said aperture plate in a position to electrically contact the common terminal electrodes of the detector elements.

2. A multi-element infrared detector as recited in claim 1, wherein said infrared detector further comprises a common metal line formed on said substrate and connected to said common terminal electrodes to present a comb-like patterned photoconductive layer.

3. A multi-element infrared detector as recited in claim 2, wherein said auxiliary electrode contacts said common metal line.

4. A multi-element infrared detector as recited in claim 2, wherein a pad portion is formed at the end of said common metal line for connection to outside circuitry.

5. A multi-element infrared detector as recited in claim 2, wherein said photoconductive layer is formed of the same material as the photosensitive zone.

6. A multi-element infrared detector as recited in claim 1, wherein said plurality of detector elements is formed to present two arrays on the substrate, the two arrays being arranged in parallel with each other and being symmetrical with respect to a center line therebetween.

7. A multi-element infrared detector as recited in claim 6, wherein two spaced auxiliary electrodes are formed on the aperture plate, each auxiliary electrode being arranged to cooperate with a respective array of detector elements.

8. A multi-element infrared detector as recited in claim 1, wherein said photosensitive zone comprises photoconductive layer of mercury cadmium telluride (HgCdTe).

9. A multi-element infrared detector as recited in claim 8, wherein said photosensitive zone has a thickness ranging from 8 to 12 microns.

10. A multi-element infrared detector as recited in claim 1, wherein said auxiliary electrode has a thickness greater than 5 microns.

11. A multi-element infrared detector as recited in claim 1, wherein said auxiliary electrode is formed of indium, gold or a gold alloy.

12. A multi-element infrared detector as recited in claim 3, wherein said photoconductive layer is formed of the same material as the photosensitive zone.

13. A multi-element infrared detector as recited in claim 4, wherein said photoconductive layer is formed of the same material as the photosensitive zone.

14. A multi-element infrared detector as recited in claim 10, wherein said auxiliary electrode has a thickness of about 10 microns.

* * * * *

UNITED STATES PATENT AND TRADEMARK OFFICE
CERTIFICATE OF CORRECTION

PATENT NO. : 5,006,711
DATED : April 9, 1991
INVENTOR(S) : SHIGEKI HAMASHIMA, MASARU KOSETO and SHOJI NOMURA It is certified that error appears in the above-identified patent and that said Letters Patent is hereby corrected as shown below:

Column 3, line 62, after" substrate" insert --1--.

Column 4, line 35, after "plate" insert --7--;

line 63, "o" should be --on--.

Signed and Sealed this

First Day of September, 1992

Attest:

DOUGLAS B. COMER

*Attesting Officer*   *Acting Commissioner of Patents and Trademarks*